(12) United States Patent
Fukazawa et al.

(10) Patent No.: US 7,825,040 B1
(45) Date of Patent: Nov. 2, 2010

(54) METHOD FOR DEPOSITING FLOWABLE MATERIAL USING ALKOXYSILANE OR AMINOSILANE PRECURSOR

(75) Inventors: Atsuki Fukazawa, Tama (JP); Hisashi Tazawa, Tsuruoka (JP); Jeongseok Ha, Tama (JP); Shintaro Ueda, Tama (JP)

(73) Assignee: ASM Japan K.K., Tokyo (JP)

( * ) Notice: Subject to any disclaimer, the term of this patent is extended or adjusted under 35 U.S.C. 154(b) by 0 days.

(21) Appl. No.: 12/489,252

(22) Filed: Jun. 22, 2009

(51) Int. Cl.
*H01L 21/31* (2006.01)

(52) U.S. Cl. .................. 438/778; 438/99; 438/221; 438/424; 257/E21.191; 257/E21.545; 257/E21.553

(58) Field of Classification Search .................. 438/764; 257/E21.191, E21.555
See application file for complete search history.

(56) References Cited

U.S. PATENT DOCUMENTS

| 2008/0076266 A1 | 3/2008 | Fukazawa et al. |
| 2009/0142935 A1 | 6/2009 | Fukazawa et al. |

*Primary Examiner*—Charles D Garber
*Assistant Examiner*—Cheung Lee
(74) *Attorney, Agent, or Firm*—Snell & Wilmer L.L.P.

(57) ABSTRACT

A method of filling a recess with an insulation film includes: introducing an alkoxysilane or aminosilane precursor containing neither a Si—C bond nor a C—C bond into a reaction chamber where a substrate having an irregular surface including a recess is placed; and depositing a flowable Si-containing insulation film on the irregular surface of the substrate to fill the recess therewith by plasma reaction at $-50°$ C. to $100°$ C.

14 Claims, 3 Drawing Sheets

METHOD FOR DEPOSITING FLOWABLE MATERIAL USING ALKOXYSILANE OR AMINOSILANE PRECURSOR

BACKGROUND OF THE INVENTION

1. Field of the Invention

The present invention relates generally to a semiconductor technique and more particularly to a method for depositing a flowable material using an alkoxysilane or aminosilane precursor on a substrate having an irregular surface.

2. Description of the Related Art

In recent years, there has been a practice of using a plasma CVD apparatus equipped with a low-temperature susceptor to deposit onto a silicon substrate an insulating liquid material having flowability, after which the deposited material is filled by means of surface tension into trenches of semiconductor circuitry having irregular surface. According to an evaluation of low-temperature plasma CVD using an alkoxide siloxane material having one Si, however, filled shape problems called "voids" occurred in trenches when trenches having irregular surface were completely filled with a material of low flowability (refer to U.S. Patent Laid-open No. 2008/0076266A1 for example). Based on the above, flowability was improved by introducing a hydrocarbon gas expressed by CxHy (refer to the same document mentioned above). As a result, however, use of such hydrocarbon gas as an additive gas resulted in a higher content of carbon in the liquid insulation material that has been formed into a film and consequently large amounts of CxHyOH, Si—CxHy, SiOH, etc., were taken in.

In view of the above, the inventors of the present invention conducted various experiments to evaluate the removal of the aforementioned substances in post-deposition processes, but in all cases the shrinkage of film became extremely high and the film cracked or its density in trenches having irregular surface became low, thereby creating hole-like spherical voids, and these conditions were difficult to improve. In particular, the film shrinkage exceeded 30% in many cases, although it became as low as approx. 20% under certain conditions. As a result, it was considered that flowability and film shrinkage would be in a trade-off relationship.

SUMMARY OF THE INVENTION

The inventors began evaluating silazane-based materials, such as those having a Si—N skeleton without OH, to establish a technology to ensure flowability while reducing the film shrinkage at the same time (U.S. Patent Application Publication No. 2009/0142935, the disclosure of which is herein incorporated by reference in its entirety). However, in some cases problems occurring in post-deposition processes could not be prevented completely and these problems were suspected to be caused by carbon, just like when siloxane is used. Accordingly, the inventors subsequently reduced the carbon content in the material to reduce the film shrinkage to 20% or lower, while at the same time improving the chemical resistance in trenches having irregular surface (U.S. patent application Ser. No. 12/331,309 which is owned by the same assignee as in this application, and the disclosure of which is herein incorporated by reference in its entirety). However, siloxane-based materials have an advantage in terms of their lower cost, and thus it was necessary to reexamine ways to prevent conventional problems by means of material control. Accordingly, the inventors searched for a material capable of solving these problems and eventually filed the prevent application for patent.

In an embodiment where at least one problem can be solved, a method of filling a recess with an insulation film comprises: (i) introducing an alkoxysilane or aminosilane precursor containing neither a Si—C bond nor a C—C bond into a reaction chamber where a substrate having an irregular surface including a recess is placed; and (ii) depositing a flowable Si-containing insulation film on the irregular surface of the substrate to fill the recess therewith by plasma reaction at −50° C. to 100° C.

In an embodiment, the alkoxysilane or aminosilane precursor may be an alkoxysilane compound having O—Si—O bonds. In an embodiment, the alkoxysilane compound may be at least one of the following:

wherein each R is independently H or $CH_3$.

In an embodiment, the alkoxysilane or aminosilane precursor may be an aminosilane compound having N—Si—N bonds. In an embodiment, the aminosilane compound may be at least one of the following:

wherein each R is independently H or $CH_3$.

In any of the foregoing embodiments, when introducing the alkoxysilane or aminosilane precursor into the reaction chamber, an oxygen-supplying gas may be introduced at a flow rate less than a flow rate of the alkoxysilane or aminosilane precursor into the reaction chamber.

In any of the foregoing embodiments, when introducing the alkoxysilane or aminosilane precursor into the reaction chamber, no oxygen-supplying gas may be introduced into the reaction chamber.

In any of the foregoing embodiments, when introducing the alkoxysilane or aminosilane precursor into the reaction chamber, an inert gas and/or a nitrogen-containing gas may be introduced into the reaction chamber.

In any of the foregoing embodiment, the irregular surface of the substrate may be constituted by a resist or barrier metal. In an embodiment, the method may further comprise plasma- or thermal-treating the irregular surface with an inert gas and/or a nitrogen-containing gas without an oxygen-containing gas before introducing the alkoxysilane or aminosilane precursor into the reaction chamber.

In any of the foregoing embodiments, the irregular surface of the substrate may be constituted by a shallow trench isolation (STI) structure or pre-metal dielectric (PMD) layer. In an embodiment, the method may further comprise plasma- or thermal-treating the irregular surface with an inert gas, a nitrogen-containing gas, and/or an oxygen-containing gas before introducing the alkoxysilane or aminosilane precursor into the reaction chamber.

In any of the foregoing embodiment, the method may further comprise treating the flowable Si-containing insulation film deposited on the irregular surface using heat, UV irradiation, or electron-beam irradiation in an atmosphere of an inert gas or an oxidizing gas, thereby converting the flowable Si-containing insulation film into an silicon oxide film.

In any of the foregoing embodiments, when introducing the alkoxysilane or aminosilane precursor into the reaction chamber, no gas that contains carbon may be introduced into the reaction chamber.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not necessarily to scale.

DETAILED DESCRIPTION OF THE PREFERRED EMBODIMENT

As explained earlier, it has been confirmed, from the viewpoint of flowability, that adopting a material having $SiCH_3$ or $Si-C_2H_5$ bond would lower the viscosity of flowable insulation deposit. Since the viscosity tends to rise under certain conditions, hydrocarbon materials expressed by CxHy and CxHyOz have traditionally been used, or they have been mixed with oxide gases such as $O_2$, $O_3$ and $N_2O$, to lower the viscosity and thereby improve the filling characteristics (refer to U.S. Patent Laid-open No. 2008/0076266A1 for example). As a result, hydrocarbons, OH-based substances such as SiOH, $H_2O$ and $CH_3OH$ are introduced to the film, due to use of these additive gases, and this necessitates removal of these substances in post-deposition processes. Also because the material has a silicon-hydrocarbon skeleton like $Si-CH_3$, such skeleton remains in its original form at least partially in the film. In light of the above, it is necessary to release carbon from the film and remove OH-based impurities from the formed film, so as to form a Si—O skeleton in the film.

In U.S. Patent Laid-open No. 2008/0076266A1, combinations of post-deposition process, such as combinations of oxidation process, high-temperature heat treatment, etc., are evaluated and it is found that the film shrinkage becomes approx. 10 to 30% due to impurities. These films tend to have slightly different film qualities depending on the PMD and STI dimensions, and while good results were achieved at the Line/Space ratio of approx. 100/100 nm used in the original evaluation, in a chemical resistance test conducted with the Line/Space ratio adjusted to below 100/100 nm and carried out with the pattern cross-section formed first (exposed), film was removed only in PMD and STI trenches. It is estimated that, as the line width shrank, the initial flowable deposit that had been formed by plasma CVD entered narrow trenches at higher ratios due to surface tension.

Evaluations have also been conducted by using methods where materials containing $Si-CH_3$ are used but no additive gas is used. When the $Si-CH_3$ bond is substituted by Si—O, sometimes impurities are generated and other unwanted phenomena occur due to removed carbon. Accordingly, lower film density, residual carbon in trenches having irregular surface and other unwanted outcomes become of concern, which are caused by separation of carbon in the final process, which is a heat treatment at 600° C. or above. In particular, the efficiency of substitution with Si—O, and generation of residual fine carbon, present concerns if the material has a structure such as $Si-CH_3$ or $Si-C_2H_5$ (U.S. Patent Publication No. 2008/0305648 and U.S. patent application Ser. No. 11/949,701 which is owned by the same assignee as in this application, the disclosure of each of which is herein incorporated by reference in their entirety).

Based on the above, the inventors examined using the $Si-C_2H_4-Si$ structure to improve the carbon separation efficiency, while using a material constituted only by SiH or SiNH having Si—Si bond and absolutely free from carbon to prevent the aforementioned problems (U.S. patent application Ser. No. 12/331,309 which is owned by the same assignee as in this application, and the disclosure of which is herein incorporated by reference in its entirety). According to this method, the oxidation substitution adds O between Si and Si to create Si—O—Si, and the resulting expansion prevents shrinking of film to a large extent. At the same time, no carbon impurities are contained in trenches having irregular surface and therefore the film quality in trenches improves substantially. As a result, the problem of pattern-dependent chemical resistance is resolved.

Under an embodiment of the present invention, a material is proposed that has a Si—O skeleton and can exist in a condition free from impurities generated from carbon in steps immediately after deposition, in consideration of the fact that many semiconductor device applications require filling with oxide film, that some processes require filler oxide film during low-temperature processing, and that the same material may be used in all applications.

Take note that in some embodiments, the following conditions are used, as an example, for depositing a Si-containing insulation material while maintaining flowability at the same time (figures in parentheses represent representative embodiments).

TABLE 1

| Precursor [sccm] | Inert gas [sccm] | O-supply gas [sccm] | Pressure [Pa] | RF (...~...MHz) [W] | Distance between electrodes [mm] | Susceptor Tem. [° C.] |
|---|---|---|---|---|---|---|
| Alkoxysilane with no Si—C bonds | 20~400 (20~200) | 500~2000 (500~1500) | 0~2000 (0~400) | 133~1000 (133~400) | 10~400 (20~100) | 10~30 (16~24) | -50~100 (-10~50) |
| Aminosilane with no Si—C bonds | 20~400 (20~200) | 500~2000 (500~1500) | 40~2000 (40~800) | 133~1000 (133~400) | 10~400 (20~100) | 10~30 (16~24) | -50~100 (-10~50) |

The present invention includes the above mentioned embodiments and other various embodiments including the following which are not intended to limit the present invention:

1) A method for depositing a filler oxide film constituted by an alkoxide and aminosilane material having no Si—CH$_3$ bond, wherein said method is characterized in that plasma CVD is used to deposit a flowable insulation material at temperatures of −50 to 100° C. (typically −10 to 50° C.) in order to keep the carbon content in the flowable deposit extremely low. This deposit presents superior flowability even through it has no Si—CH$_3$ bond and no additive materials are required. Based on the above, said method for depositing a silicon oxide film can support device processes implemented at low temperatures (100 to 400° C.) to high temperatures (700 to 1050° C.).

2) A method according to 1) above, wherein the base skeleton of the alkoxide and alkylamine material used to form a good silicon oxide film towards high temperature is as follows:

wherein each R is independently H or CH$_3$.

As for the material, one type of gas may be used alone, or two or more types of gases can be combined.

3) A method according to 1) above, characterized in that said method involves formation of flowable deposit by means of plasma CVD and the gas introduced to the reaction chamber simultaneously with the material specified in 2) above is one gas or a mixture of multiple gases selected from the group that includes He, Ar and other inert gases as well as N2, NH3 and other nitrogen gases. Take note that oxygen may also be introduced as an option.

4) A method according to 1) above, characterized in that said method is intended to prevent damage to the processing target in resist, barrier metal and other applications, where no pre-treatment is performed using O2, O3, N2O, etc., and pre-treatment is performed only in the form of plasma processing or gas heating using N2, NH3 or other nitrogen gas, or where all pre-treatment processes are entirely skipped.

5) A method according to 1) above, characterized in that said method is implemented, in STI, PMD or other processes that permit high-temperature heat treatment, by selecting one gas or a mixture of multiple gases from the group that includes He, Ar and other inert gases as well as N2, NH3 and other nitrogen gases and O2, N2O, O3 and other oxide gases and then plasma-processing or heating the selected gas or mixture of gases.

6) A method according to 1) above, characterized in that said post processing method uses treatment by heat, UV irradiation or electron beam irradiation at 172 to 300 nm in wavelength and is implemented using one gas or a mixture of gases selected from N2, He, Ar and other inert gases as well as O3, O2, H2O and other oxide gases. Take note that if the base structure conforms to STI or PMD, oxidation is performed at 400° C. or below and then heat treatment is performed in the atmosphere of an inert gas or N$_2$ at temperatures in a range of 600 to 1050° C. If the base structure is resist, barrier metal film or any other structure whose heat resistance is low, processes are performed at temperatures in a range of 100 to 400° C.

7) A method according to 4) above, where, if a need arises to prevent damage to the processing target due to oxidation of resist, barrier metal, etc., then basically the gas introduced to the reaction chamber simultaneously with the material specified in 2) above is one gas or a combination of multiple gases selected from the group that includes N2, NH3 and other nitrogen gases as well as H2, Ar and other inert gases. If O2, O3, N2O or other oxide gas is introduced, the flow rate of the applicable oxide gas is adjusted to 3 or less (or 1 or less in an embodiment) relative to the flow rate of the material, because this allows for prevention of damage to the processing target.

8) A method according to 5) above, where, if a need arises to heat-treat the processing target at high temperatures of 400 to 1050° C. as is the case of PMD, STI, etc., then basically the gas introduced to the reaction chamber simultaneously with the material specified in 2) above is one gas or a combination of multiple gases selected from the group that includes N2, NH3 and other nitrogen gases as well as He, Ar and other inert gases. If O2, O3, N2O or other oxide gas is introduced, the flow rate of the applicable oxide gas is adjusted to equal or more than, or typically not more than three times (or preferably equal to or twice), the flow rate of the material.

9) A method according to 1) above, characterized in that sufficient flowability is ensured by using the material specified in 2) above and also in that no hydrocarbon gases for promoting flowability, such as those expressed by CxHy or CxHyOz, are introduced.

In the present disclosure where conditions and/or structures are not specified, the skilled artisan in the art can readily provide such conditions and/or structures, in view of the present disclosure, as a matter of routine experimentation. Additionally, the conditions and/or structures disclosed in U.S. Patent Publication No. 2008/0305648 and U.S. patent application Ser. No. 11/465,751 (owned by the same assignee as in this case) can be used in embodiments of the present invention, the disclosure of each of which is herein incorporated by reference in their entirety.

EXAMPLES

The present invention will be explained with reference to examples which are not intended to limit the present invention.

Example 1

Figure 3:
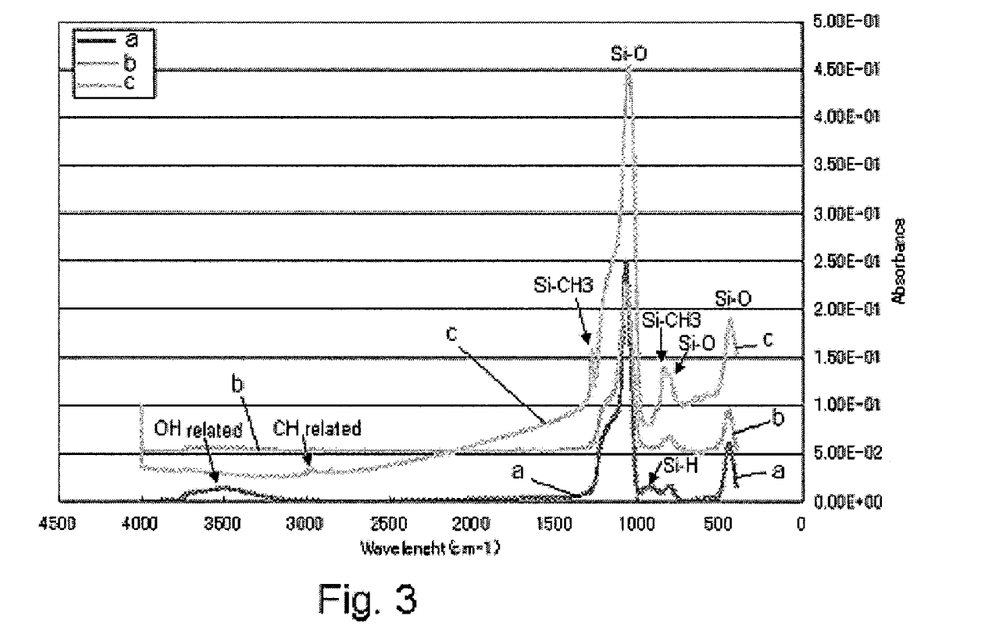
FIG. 3 is an FT-IR chart of films upon film deposition, using as a precursor tetramethoxysilane (a), hexamethoxydisilane (b), and monomethyethoxysilane (c), respectively.

To identify a material that allows for achievement of a Si—O state immediately after deposition without causing carbon impurities from being taken into the film, those that do not directly contain Si and hydrocarbon bond were examined. To be specific, an evaluation was conducted to identify whether the amount of carbon impurities taken into the deposited insulation material having flowability could be reduced substantially based on plasma CVD by using a material whose skeleton is Si—O—$CH_3$ or Si—N—$CH_3$ where oxygen or nitrogen is sandwiched between Si and carbon. For the Si-containing precursors not having Si—C bond used in this evaluation, tetramethoxysilane and hexamethoxydisilane were used. For the Si-containing precursor having Si—C bond, monomethyltriethoxysilane was used. The deposition conditions are shown below.

ately after deposition, which indicates that Si—C bond is virtually not formed. On the other hand, monomethyltriethoxysilane (c), which is a Si-containing hydrocarbon material having a Si—C bond, is shown to have carbon peaks and this indicates that the film has Si—C bond.

Although a hexamethoxydisilane material was used in the evaluation, similar results are obtained from other similar materials such as hexaminodisilane. Table 3 lists the typical conditions. In the case of aminosilane, in the evaluation the flow rate of $O_2$ was adjusted to twice (typically twice to four times) the flow rate of the material. These results confirm that the content of carbon impurities in the film is different according to the base skeleton of the material.

TABLE 3

| Material | Flow rate of material (sccm) | He (sccm) | O2 (sccm) | Pressure (Pa) | 13.56 MHz (W) | Discharge distance (mm) | Susceptor (° C.) |
|---|---|---|---|---|---|---|---|
| Hexamethoxydisilane | 20 | 1000 | 0 | 266 | 100 | 20 | 0 |
| Hexaaminodisilane | 20 | 1000 | 40 | 266 | 100 | 20 | 0 |

Additionally, the FT-IR peak immediately after deposition shows Si—O, which explains that even when the post-treatment temperature is approx. 100° C., a silicon oxide film can still be formed and applied to the resist structure, etc. In the case of monomethyltriethoxysilane material containing one carbon bonding with Si, it is difficult to form a perfect silicon oxide film because of the presence of carbon, and therefore it becomes necessary to introduce a large amount of oxygen or implement steam treatment when oxidation occurs in a post-curing process or during the deposition process. As a result, damage to the base resist increases significantly.

Based on the above points, post-curing at low to high temperatures can be accommodated in an embodiment of the present invention where a silicon oxide film is formed after deposition, as shown by the FT-IR graph in FIG. 3, which confirms superiority of the present invention.

Example 2

To identify a material that allows for achievement of a Si—O state immediately after deposition without causing

TABLE 2

| Precursor | [sccm] | He gas [sccm] | O2 gas [sccm] | Pressure [Pa] | RF (13.56 MHz) [W] | Distance between electrodes [mm] | Susceptor Tem. [° C.] |
|---|---|---|---|---|---|---|---|
| tetramethoxysilane | 50 | 1000 | 50 | 266 | 50 | 20 | 0 |
| hexamethoxydisilane | 20 | 1000 | 0 | 266 | 100 | 20 | 0 |
| Monomethylmethoxysilane | 50 | 1000 | 50 | 266 | 50 | 20 | 0 |

Results are shown in FIG. 3, which is a FT-IR graph showing the condition of bond in the formed film. As shown in FIG. 3, films using tetramethoxysilane (a) and hexamethoxydisilane (b), which is a Si-containing hydrocarbon material having no Si—C bond, do not have carbon peaks, even immedicarbon impurities from being taken into the film, materials that do not directly contain Si and hydrocarbon bond, or specifically tetramethoxysilane containing O—$CH_3$ and tetraethoxysilane containing O—$C_2H_5$, were compared. The deposition conditions are as follows.

TABLE 4

| Precursor | [sccm] | He gas [sccm] | O2 gas [sccm] | Pressure [Pa] | RF (13.56 MHz) [W] | Distance between electrodes [mm] | Susceptor Tem. [° C.] |
|---|---|---|---|---|---|---|---|
| Ttramethoxysilane | 50 | 1000 | 50 | 266 | 50 | 20 | 0 |
| Tetraethoxysilane | 50 | 1000 | 50 | 266 | 50 | 20 | 0 |

Figure 4:
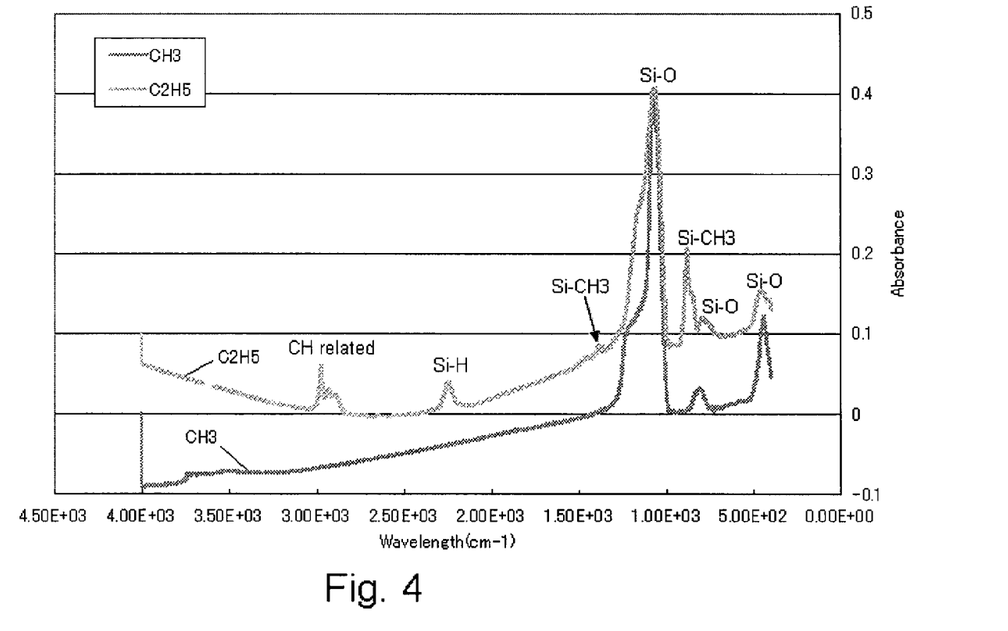
FIG. 4 is an FT-IR chart of films upon film deposition, using as a precursor tetramethoxysilane (CH3) and tetraethoxysilane (C2H5), respectively.

Results are shown in FIG. 4, which is a FT-IR graph showing the condition of bond in the formed film. In this embodiment, the precursor has a hydrocarbon as the terminal group, where the terminal hydrocarbon is $CH_3$. In addition to $CH_3$, $C_2H_5$, $C_3H_7$, etc., can be cited as candidate hydrocarbons. As evident from the FT-IR graph in FIG. 4 showing the confirmed condition of carbon content after deposition, adopting $CH_3$ as the terminal group eliminates peaks of carbon bond. With $C_2H_5$ and $C_3H_7$, on the other hand, they break down in the deposition process and therefore tend to remain in the film. Accordingly, post-treatment becomes necessary to remove the residual breakdown products and this makes it difficult to apply these materials to low-temperature processes. In addition, use of these materials also presents concerns over film shrinkage when carbon separates.

Example 3

To evaluate STI filler oxide films having high-temperature resistance, films were deposited under the process conditions listed below (susceptor temperature: 0° C.).

In the table, a downward pointing arrow indicates that the immediately overlying entry is carried over to the box containing the arrow.

Figure 2A:
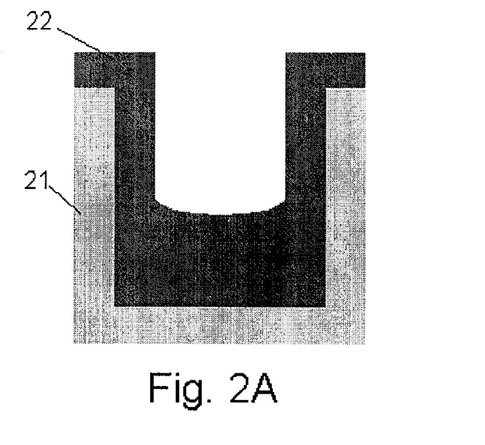
FIGS. 2A and 2B are schematic cross sectional views illustrating viscosity-dependent filling property of flowable material wherein the line width and a space between lines are 20 nm and 40 nm, respectively.
Figure 2B:
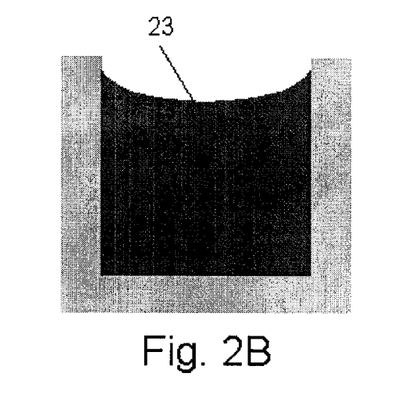

Additionally, the flowability pattern diagrams indicating in the last column of Table 5 show the results of evaluating chemical resistance in the filled film and pattern based on the Line/Space ratio of 20/40 nm, as explained in FIGS. 2A and 2B. In condition A where the viscosity is high (FIG. 2A), flowable material 22 is not filled sufficiently in the concaved section 21 of the substrate. In condition B where the viscosity is low (FIG. 2B), on the other hand, the concaved section 21 of the substrate is sufficiently filled with flowable material 23. Filling characteristics are clearly superior in these examples, except for Examples 3-3 and 3-10. In Examples 3-3 and 3-10, the viscosity of deposit may rise because the amount of oxygen is too high in the case of 3-3, or the amount of RF impression level is high in the case of 3-10. In these examples, the flowability pattern corresponds to A in FIG. 2A.

Example 4

Next, a mixture of $H_2O$ and $O_2$ was used to steam-treat the section between Si and Si after deposition for 30 minutes at

TABLE 5

| Example | Material | Flow rate of material (sccm) | O₂ flow rate (sccm) | He flow rate (sccm) | Pressure (Pa) | 13.56 Mhz (W) | Discharge distance (mm) | Flowability pattern diagram |
|---|---|---|---|---|---|---|---|---|
| 3-1 | Hexamethoxydisilane | 20 | 0 | 1000 | 266 | 100 | 20 | B |
| 3-2 | ↓ | ↓ | 50 | ↓ | ↓ | ↓ | ↓ | ↓ |
| 3-3 | ↓ | ↓ | 200 | ↓ | ↓ | ↓ | ↓ | A |
| 3-4 | ↓ | ↓ | 0 | ↓ | 133 | ↓ | ↓ | B |
| 3-5 | ↓ | ↓ | 50 | ↓ | 266 | ↓ | ↓ | ↓ |
| 3-6 | Hexaaminodisilane | 20 | 40 | ↓ | ↓ | ↓ | ↓ | ↓ |
| 3-7 | ↓ | 20 | 20 | ↓ | ↓ | ↓ | ↓ | ↓ |
| 3-8 | Trimethoxysilanol | 100 | 0 | ↓ | 400 | ↓ | ↓ | ↓ |
| 3-9 | ↓ | ↓ | ↓ | ↓ | 266 | ↓ | ↓ | ↓ |
| 3-10 | Hexamethoxydisilane | 20 | ↓ | ↓ | ↓ | 300 | ↓ | A |

400° C., after which heat treatment is given in a $N_2$ atmosphere at 800° C. The results are shown in Table 6.

TABLE 6

| Example | Filling performance | Rate of change in film thickness after oxidation at 400° C. (%) | Rate of change in film thickness after $N_2$ heat treatment at 800° C. (%) | Total rate of change in film thickness (%) | Chemical resistance of film in trenches Condition for removing 5 nm of thermal oxide film | RI |
|---|---|---|---|---|---|---|
| 3-1 | Good, no voids | +12 | −18 | −6 | Good, no voids, etc., in trenches | 1.44 |
| 3-2 | ↓ | +9 | −15 | −6 | ↓ | 1.45 |

TABLE 6-continued

| Example | Filling performance | Rate of change in film thickness after oxidation at 400° C. (%) | Rate of change in film thickness after N₂ heat treatment at 800° C. (%) | Total rate of change in film thickness (%) | Chemical resistance of film in trenches Condition for removing 5 nm of thermal oxide film | RI |
|---|---|---|---|---|---|---|
| 3-3 | ↓ | +8 | −15 | −6 | Voids | 1.45 |
| 3-4 | ↓ | +2 | −8 | −6 | Good, no voids, etc., in trenches | 1.46 |
| 3-5 | ↓ | +1 | −10 | −9 | ↓ | 1.46 |
| 3-6 | ↓ | +8 | −5 | +5 | ↓ | 1.48 |
| 3-7 | ↓ | +6 | −6 | 0 | ↓ | 1.47 |
| 3-8 | ↓ | 0 | −7 | −7 | ↓ | 1.44 |
| 3-9 | ↓ | −2 | −6 | −8 | ↓ | 1.45 |
| 3-10 | Voids | +3 | −5 | −2 | Voids | 1.45 |

When steam treatment was given at 400° C. for 30 minutes after deposition, little film shrinkage occurred and this indicates the effectiveness of substituting the Si—Si bond with Si—O—Si. Thereafter, heat-treatment in a N₂ atmosphere at 800° C. removes water and other impurities, and this results in shrinking of film. Since the final film shrinkage is lower than 10%, it is confirmed that use of the material proposed in this embodiment is effective in PMD and STI applications where resistance to high temperature is required. It has also been confirmed that the aforementioned effect enables application of the present invention to high-temperature applications. Additionally, evaluation of film quality in trenches having irregular surface, which is the most important evaluation items above, evaluates the result of etching and thus removing the thermal oxide film by 5 nm by soaking the film in both BHF130 and LAL500 solutions with the cross-section of the irregular pattern formed first (exposed), and it also evaluates, based on the foregoing result, whether film quality in STI trenches (STI=Shallow Trench and Isolation: L/S=20/40 nm) and flat film on top of the STI pattern are also removed. In the aforementioned examples, good results were obtained without film quality being removed in trenches. As shown, the aforementioned films are found chemically resistant and this is considered a reason why the content of carbon impurities in trenches having irregular surface was reduced significantly.

Example 5

Since carbon is not contained in the deposited film in an embodiment of the present invention, effectiveness of applying the present invention to processes involving low-temperature post-curing was examined. To be specific, filler oxide films were evaluated in a condition where damage to the processing target such as a resist pattern or barrier metal pattern is minimized. Since the heat resistance of resist patterns is approx. 150° C. (refer to JP 1996-082926A1 for example), two conditions were checked including one involving no post-curing after deposition and the other involving heat treatment based on mixture of oxygen and He or N₂ at 100° C. For the resist pattern, a structure of 100 nm in height and 100 nm in width was used. The obtained results were used to evaluate, in terms of rate of change, the damage suffered by the resist pattern under the oxide film conditions conforming to the present invention. Two materials, or specifically tetramethoxydisilane and hexaethoxydisilane, were used in the evaluation (Table 7).

TABLE 7

| Material | Flow rate of material (sccm) | He (sccm) | O2 (sccm) | Pressure (Pa) | 13.56 MHz (W) | Discharge distance (mm) | Susceptor (° C.) |
|---|---|---|---|---|---|---|---|
| Tetramethoxydisilane | 30 | 1000 | 0 | 400 | 100 | 20 | 0 |
| ↓ | 30 | 1000 | 30 | 400 | 100 | 20 | 0 |
| ↓ | 30 | 1000 | 90 | 400 | 100 | 20 | 0 |
| Hexamethoxydisilane | 20 | 1000 | 0 | 266 | 100 | 20 | 0 |

After the deposition process, the size of resist pattern was evaluated using the length measuring function of a FE-SEM microscope. The results found a shrinkage of approx. 5 nm in height and width. Although the resist pattern shrinks by several nanometers or so when the method conforming to this embodiment is used, the shrinkage is only approx. 5% and this is not considered a problematic level.

Example 6

An evaluation was conducted in the same manner as in Example 5 with respect to applications with low-temperature post-curing and without post-curing under the conditions listed in Table 8.

TABLE 8

| Example | Material | Flow rate of material (sccm) | He (sccm) | O2 (sccm) | Pressure (Pa) | 13.56 MHz (W) | Discharge distance (mm) | Susceptor temperature (° C.) |
|---|---|---|---|---|---|---|---|---|
| 6-1 | Tetramethoxydisilane | 80 | 1000 | 260 | 400 | 100 | 20 | 0 |
| 6-2 | ↓ | ↓ | ↓ | 80 | ↓ | ↓ | ↓ | ↓ |
| 6-3 | ↓ | ↓ | ↓ | 40 | ↓ | ↓ | ↓ | ↓ |
| 6-4 | ↓ | ↓ | 40 | ↓ | ↓ | ↓ | ↓ | ↓ |
| 6-5 | ↓ | ↓ | ↓ | ↓ | 666 | ↓ | ↓ | ↓ |
| 6-6 | ↓ | ↓ | ↓ | ↓ | ↓ | ↓ | ↓ | 25 |
| 6-7 | Hexamethoxydisilane | 20 | ↓ | 0 | 266 | ↓ | ↓ | 0 |
| 6-8 | ↓ | ↓ | ↓ | ↓ | ↓ | ↓ | ↓ | 25 |

The results are shown in Table 9.

TABLE 9

| | After deposition | | | 10 minutes after heat treatment in O$_2$/N$_2$ atmosphere at 100° C. | | | | |
|---|---|---|---|---|---|---|---|---|
| Example | Shrinkage of base resist (%) | Ratio to etching rate at C$_3$F$_8$: 0.1 SLM/O$_2$: 1 SLM | RI | Shrinkage of base resist (%) | Film shrinkage after post-treatment at 100° C. (%) | Ratio to etching rate at C$_3$F$_8$: 0.1 SLM/O$_2$: 1 SLM | RI | Pattern |
| 6-1 | 15 | 1.7 | 1.43 | 15 | 15 | 1.5 | 1.43 | FIG. 1C |
| 6-2 | 6 | 3.6 | 1.43 | 6 | 7 | 3.5 | 1.43 | FIG. 1B |
| 6-3 | 7 | 3.3 | 1.44 | 8 | 9 | 3.3 | 1.44 | FIG. 1B |
| 6-4 | 7 | 3.2 | 1.42 | 7 | 8 | 3.1 | 1.42 | FIG. 1B |
| 6-5 | 8 | 2.7 | 1.43 | 8 | 9 | 2.7 | 1.43 | FIG. 1B |
| 6-6 | 6 | 3.5 | 1.44 | 7 | 5 | 3.4 | 1.44 | FIG. 1B |
| 6-7 | 4 | 2.3 | 1.49 | 5 | 4 | 2.1 | 1.49 | FIG. 1B |
| 6-8 | 5 | 2.4 | 1.47 | 5 | 4 | 2.2 | 1.47 | FIG. 1B |

Figure 1A:
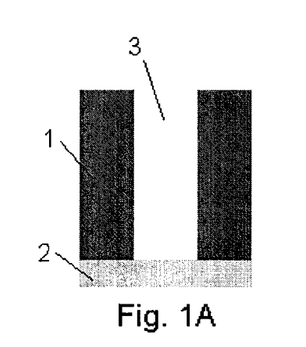
FIGS. 1A to 1E are schematic cross sectional views illustrating various patterns of resist deformation caused by oxidation damage wherein the line width and a space between lines are 100 nm.
Figure 1B:
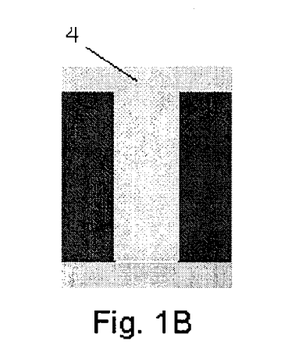
Figure 1C:
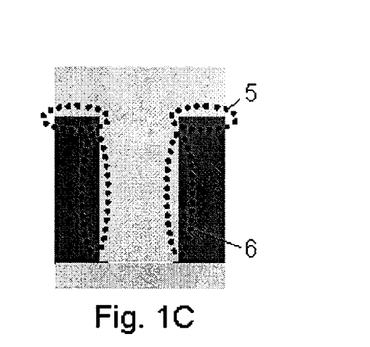
Figure 1D:
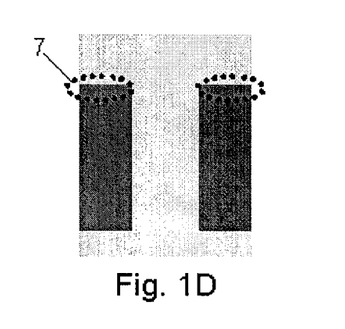
Figure 1E:
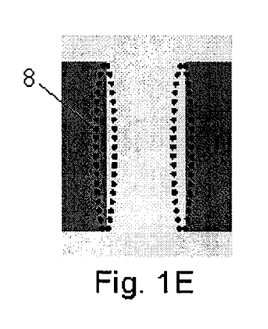

In Example 6-1, addition of oxygen by a flow rate of three times or more than that of the material already resulted in a resist shrinkage of 15% or more immediately after deposition. The shrinkage of the base resist was also 15% or more after heat treatment. When the flow rate of oxygen was equal to or less than that of the material, the resist shrinkage could be kept to less than 10% even after heat treatment. In Examples 6-7 and 6-8 where oxygen was zero, the resist shrinkage could be kept to 5% or less in both conditions after heat treatment. These results suggest that, when relatively low temperatures are used, it is effective to introduce oxygen by an amount equal to or less than 3 times that of the material gas. Additionally, the "Pattern" column in the table shows, when the concaved section 3 of resist 1 applied onto a substrate 2 is filled with a deposit 4, as shown in FIG. 1A, whether resist 1 undergoes a shape change corresponding to FIG. 1B (no damage to the base), FIG. 1C (damage to the top 5 and side walls 6 of the base structure), FIG. 1D (damage to the top 7 of the base), or FIG. 1E (damage to the side walls 8 of the base). If the oxygen level is high (Example 6-1), resist is easily damaged and the deposit also has poor resistance.

When an evaluation was conducted based on a monomethyltriethoxysilane material containing one carbon bonding with Si, it was difficult to achieve a perfect silicon oxide film because of the presence of carbon, and this necessitates introduction of a large amount of oxygen or steam treatment when oxidation occurs in a post-curing process or during the deposition process. As a result, damage to the base resist increases.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of filling a recess with an insulation film, comprising:

introducing an alkoxysilane or aminosilane precursor containing neither a Si—C bond nor a C—C bond into a reaction chamber where a substrate having an irregular surface including a recess is placed, wherein no carbon-containing gas other than the precursor is introduced into the reaction chamber, and no pre-treatment for promoting flowability of the precursor on the substrate is conducted prior to the introduction of the precursor into the reaction chamber; and depositing a flowable Si-containing insulation film on the irregular surface of the substrate to fill the recess therewith by plasma reaction at −50° C. to 100° C.

2. The method according to claim 1, wherein the alkoxysilane or aminosilane precursor is an alkoxysilane compound having O—Si—O bonds.

3. The method according to claim 2, wherein the alkoxysilane compound is at least one of the following:

wherein each R is independently H or CH$_3$.

4. The method according to claim 1, wherein the alkoxysilane or aminosilane precursor is an aminosilane compound having N—Si—N bonds.

5. The method according to claim 1, wherein when introducing the alkoxysilane or aminosilane precursor into the reaction chamber, an oxygen-supplying gas is introduced at a flow rate less than a flow rate of the alkoxysilane or aminosilane precursor into the reaction chamber.

6. The method according to claim 1, wherein when introducing the alkoxysilane or aminosilane precursor into the reaction chamber, no oxygen-supplying gas is introduced into the reaction chamber.

7. The method according to claim 1, wherein when introducing the alkoxysilane or aminosilane precursor into the reaction chamber, an inert gas and/or a nitrogen-containing gas is introduced into the reaction chamber.

8. The method according to claim 1, wherein the irregular surface of the substrate is constituted by a resist or barrier metal.

9. The method according to claim 8, further comprising plasma- or thermal-treating the irregular surface with an inert gas and/or a nitrogen-containing gas without an oxygen-containing gas before introducing the alkoxysilane or aminosilane precursor into the reaction chamber.

10. The method according to claim 1, wherein the irregular surface of the substrate is constituted by a shallow trench isolation (STI) structure or pre-metal dielectric (PMD) layer.

11. The method according to claim 10, further comprising plasma- or thermal-treating the irregular surface with an inert gas, a nitrogen-containing gas, and/or an oxygen-containing gas before introducing the alkoxysilane or aminosilane precursor into the reaction chamber.

12. The method according to claim 1, further comprising treating the flowable Si-containing insulation film deposited on the irregular surface using heat, UV irradiation, or electron-beam irradiation in an atmosphere of an inert gas or an oxidizing gas, thereby converting the flowable Si-containing insulation film into an silicon oxide film.

13. The method according to claim 1, wherein substantially no Si—C bond is formed in the depositing film.

14. A method of filling a recess with an insulation film, comprising:
   introducing an alkoxysilane or aminosilane precursor containing neither a Si—C bond nor a C—C bond into a reaction chamber where a substrate having an irregular surface including a recess is placed; and
   depositing a flowable Si-containing insulation film on the irregular surface of the substrate to fill the recess therewith by plasma reaction at −50° C. to 100° C.,
   wherein the alkoxysilane or aminosilane precursor is an aminosilane compound having N—Si—N bonds,
   wherein the aminosilane compound is at least one of the following:

wherein each R is independently H or CH$_3$.

* * * * *